United States Patent
Chen et al.

(10) Patent No.: US 8,084,357 B2
(45) Date of Patent: Dec. 27, 2011

(54) METHOD FOR MANUFACTURING A DUAL DAMASCENE OPENING COMPRISING A TRENCH OPENING AND A VIA OPENING

(75) Inventors: Wei-Chih Chen, Tainan County (TW); Su-Jen Sung, Hsin-Chu Hsien (TW); Feng-Yu Hsu, Tainan Hsien (TW); Chun-Chieh Huang, Tainan Hsien (TW); Mei-Ling Chen, Kao-Hsiung (TW); Jiann-Jen Chiou, Tainan County (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 1 day.

(21) Appl. No.: 11/733,763

(22) Filed: Apr. 11, 2007

(65) Prior Publication Data

US 2008/0251931 A1 Oct. 16, 2008

(51) Int. Cl.
*H01L 21/4763* (2006.01)

(52) U.S. Cl. . 438/637; 438/638; 438/689; 257/E21.577; 257/E21.579

(58) Field of Classification Search .......... 438/629, 438/633, 637, 638, 672, 689; 257/774, E21.576, 257/E21.577, E21.579
See application file for complete search history.

(56) References Cited

U.S. PATENT DOCUMENTS

| | | | |
|---|---|---|---|
| 6,037,237 A | 3/2000 | Park et al. | |
| 6,326,287 B1 | 12/2001 | Asahina | |
| 6,426,285 B1 | 7/2002 | Chen et al. | |
| 6,790,770 B2 | 9/2004 | Chen | |
| 6,825,529 B2 | 11/2004 | Chidambarrao et al. | |
| 6,939,725 B2 | 9/2005 | Kutsunai | |
| 7,132,369 B2 * | 11/2006 | Delgadino et al. | 438/723 |
| 7,244,629 B2 | 7/2007 | Ezaki | |
| 7,378,343 B2 | 5/2008 | Chen et al. | |
| 2003/0044726 A1 * | 3/2003 | Chen et al. | 430/314 |
| 2003/0203321 A1 | 10/2003 | Ma et al. | |
| 2004/0157453 A1 | 8/2004 | Delgadino | |
| 2005/0205519 A1 | 9/2005 | Kim et al. | |
| 2006/0043591 A1 * | 3/2006 | Yim et al. | 257/758 |
| 2007/0148966 A1 * | 6/2007 | Baks et al. | 438/638 |
| 2007/0281497 A1 | 12/2007 | Liu | |
| 2008/0020570 A1 * | 1/2008 | Naik | 438/675 |
| 2008/0138983 A1 | 6/2008 | Lien | |

FOREIGN PATENT DOCUMENTS

CN 1866528 A 11/2006

* cited by examiner

*Primary Examiner* — Khiem D Nguyen
(74) *Attorney, Agent, or Firm* — Winston Hsu; Scott Margo

(57) ABSTRACT

A method for manufacturing a multi cap layer includes providing a substrate, forming a multi cap layer comprising a first cap layer and a second cap layer formed thereon on the substrate, forming a patterned metal hard mask layer on the multi cap layer, and performing an etching process to etch the multi cap layer through the patterned hard mask layer and to form an opening in the second cap layer.

8 Claims, 17 Drawing Sheets

METHOD FOR MANUFACTURING A DUAL DAMASCENE OPENING COMPRISING A TRENCH OPENING AND A VIA OPENING

BACKGROUND OF THE INVENTION

1. Field of the Invention

The present invention relates to a multi cap layer and manufacturing method thereof, and more particularly, to a multi cap layer used in damascene interconnect processes.

2. Description of the Prior Art

Damascene interconnect processes incorporated with copper are known in the art, which are also referred to as "copper damascene processes" in the semiconductor industry. Generally, the copper damascene processes are categorized into single damascene process and dual damascene process. Because the dual damascene has advantages of simplified processes, lower contact resistance between wires and plugs, and improved reliance, it is widely applied in damascene interconnect technique. In addition, to reducing resistance and parasitic capacitance of the multi-level interconnect and improving speed of signal transmission, the dual damascene interconnect in state-of-the-art is fabricated by filling trench or via patterns located in dielectric layer which comprise low-K material with copper and performing a planarization process to obtain a metal interconnect. According to the patterns located in the dielectric layer, the dual damascene process is categorized into trench-first process, via-first process, partial-via-first process, and self-aligned process.

Please refer to FIGS. 1-5, which are schematic drawings of a conventional trench-first dual damascene process. As shown in FIG. 1, a substrate 10 having a conductive layer 12 and a base layer 14 comprising silicon nitride sequentially formed thereon is provided. And an ultra low-k (ULK) dielectric layer 16, a cap layer 18, a metal hard mask layer 20, and a bottom anti-reflective coating (BARC) layer 22 are sequentially formed on the base layer 14. Then, a photoresist layer 30 is formed and patterned to form an opening 32 by a well-known photolithography method. The opening 32 is used to define a trench pattern of a damascene structure.

Subsequently, as shown in FIG. 2, an etching process is performed. A trench recess 34 is etched into the metal hard mask layer 20 and the cap layer 18 through the opening 32. The etching is stopped on the cap layer 18. The remaining photoresist layer 30 and the BARC layer 22 are then stripped off.

As shown in FIG. 3, another BARC layer 36 is coated over the substrate 10 and fills the trench recess 34. And another photoresist layer 40 is formed on the BARC layer 36. The photoresist layer 40 has an opening 42 patterned by a conventional photolithography method. The opening 42 is situated directly above the trench recess 34 and is used to define a via pattern of a damascene structure. As shown in FIG. 4, the BARC layer 36, the cap layer 18, and the ULK layer 16 are etched through the opening 42 with the photoresist layer 40 being an etching mask. Thus, a partial via feature 44 is formed in an upper portion of the ULK layer 16. Then the remaining photoresist layer 40 and the BARC layer 36 are stripped off by using oxygen plasma.

Please refer to FIG. 5. Next, the metal hard mask layer 20 is used as an etching hard mask in an etching process, which is performed to etch away the cap layer 18 and the ULK layer 16 through the trench recess 34 and the partial via 44, thereby a dual damascene pattern comprising a trench opening 52 and a via opening 54 is obtained.

Generally, the cap layer 18 is a silicon oxide layer such as a tetra-ethyl-ortho-silicate (TEOS) based silicon oxide layer with TEOS used as a precursor. The TEOS layer comprises a compressive stress. When the TEOS layer contacts the ULK layer 16 directly, the compressive stress of the TEOS layer causes line distortion in the ULK layer 16. Moreover, since the TEOS layer is apt to absorb water, the absorbed water is then desorpted in following process and gets into the ULK layer 16, thus Kelvin via open are formed, which will reduce reliability of the process and influence electrical performance of the damascene interconnects formed followed.

SUMMARY OF THE INVENTION

Therefore the present invention provides a multi cap layer and a manufacturing method thereof to prevent line distortion and Kelvin via open formation.

According to the claimed invention, a method for manufacturing a multi cap layer is provided. The method comprises steps of providing a substrate comprising at least a conductive layer, a base layer, and a dielectric layer, forming a multi cap layer comprising at least a first cap layer and a second cap layer formed on the first cap layer on the substrate, forming a patterned metal hard mask layer on the multi cap layer, performing an etching process to etch the multi cap layer through the patterned metal hard mask layer and to form at least an opening in the second cap layer.

According to the claimed invention, another method for manufacturing a multi cap layer is provided. The method comprises steps of providing a substrate comprising at least a conductive layer, a base layer, and a dielectric layer, and forming a multi cap layer comprising at least a tensile stress layer and a first protecting layer. The tensile stress layer is thicker than the first protecting layer.

According to the claimed invention, a multi cap layer is provided. The multi cap layer comprises a first protecting layer and a tensile stress layer comprising a thickness larger than that of the first protecting layer.

According to the claimed invention, another multi cap layer is provided. The multi cap layer comprises a first protecting layer, a tensile stress layer positioned on the first protecting layer, and a second protecting layer positioned on the tensile stress layer.

According to the multi cap layer and manufacturing method thereof provided by the present invention, line distortion due to stress in pre-layer is prevented. In addition, because the protecting layer of the multi cap layer effectively prevents the multi cap layer from water absorption, the Kelvin via open resulted by water desorpted from multi cap layer in following processes is also avoided.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
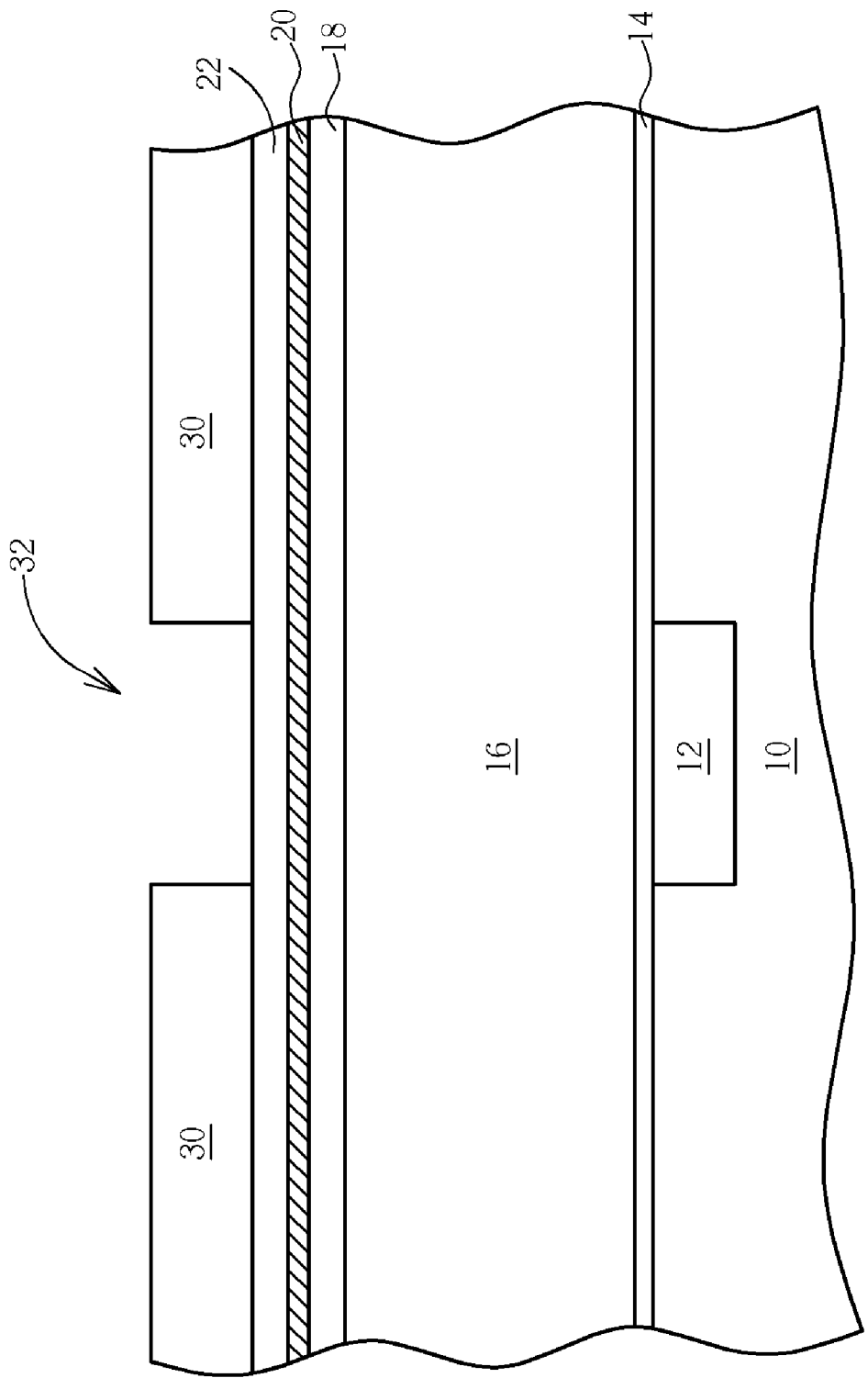
FIGS. 1-5 are schematic drawings of a conventional trench-first dual damascene process.
Figure 2:
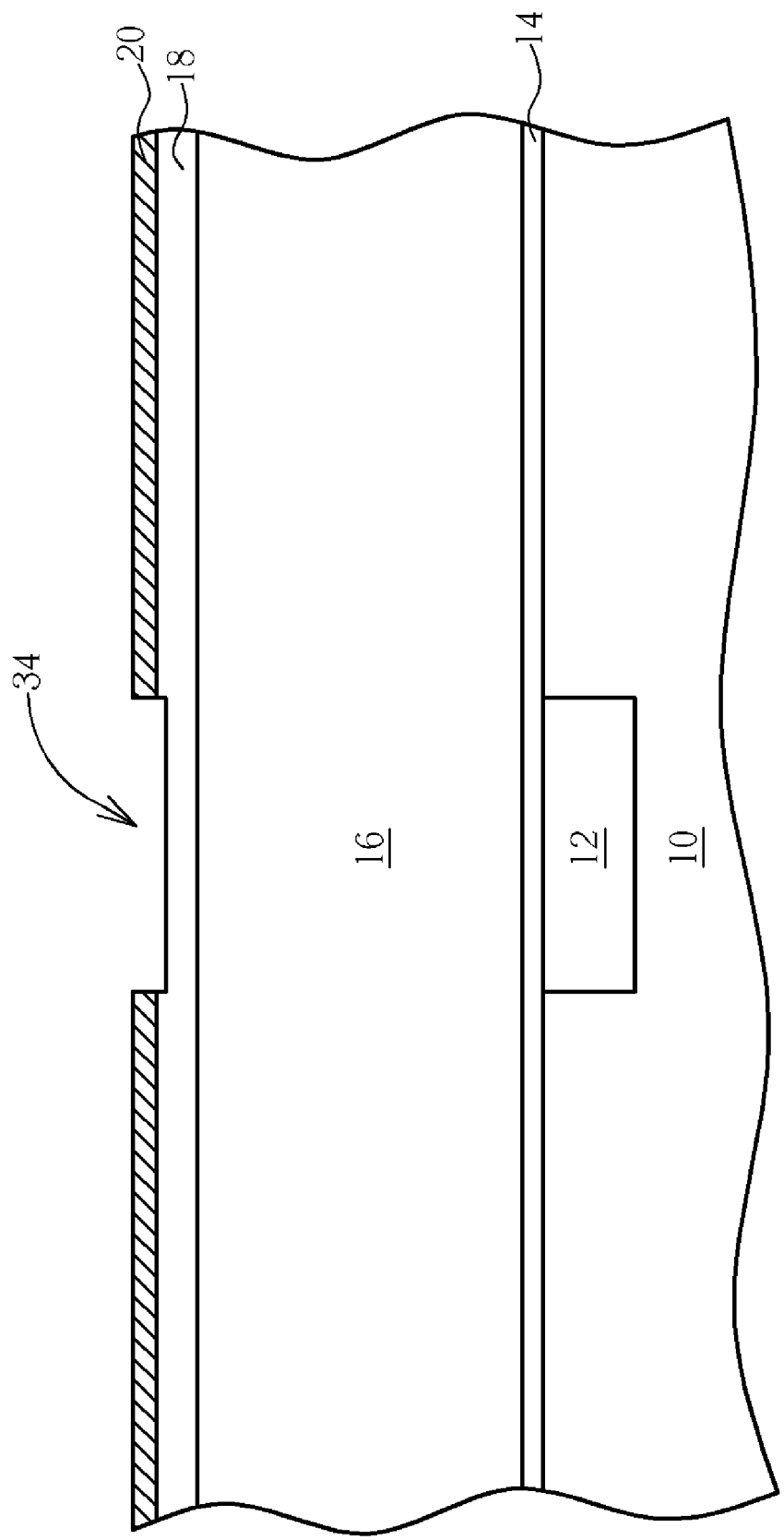
Figure 3:
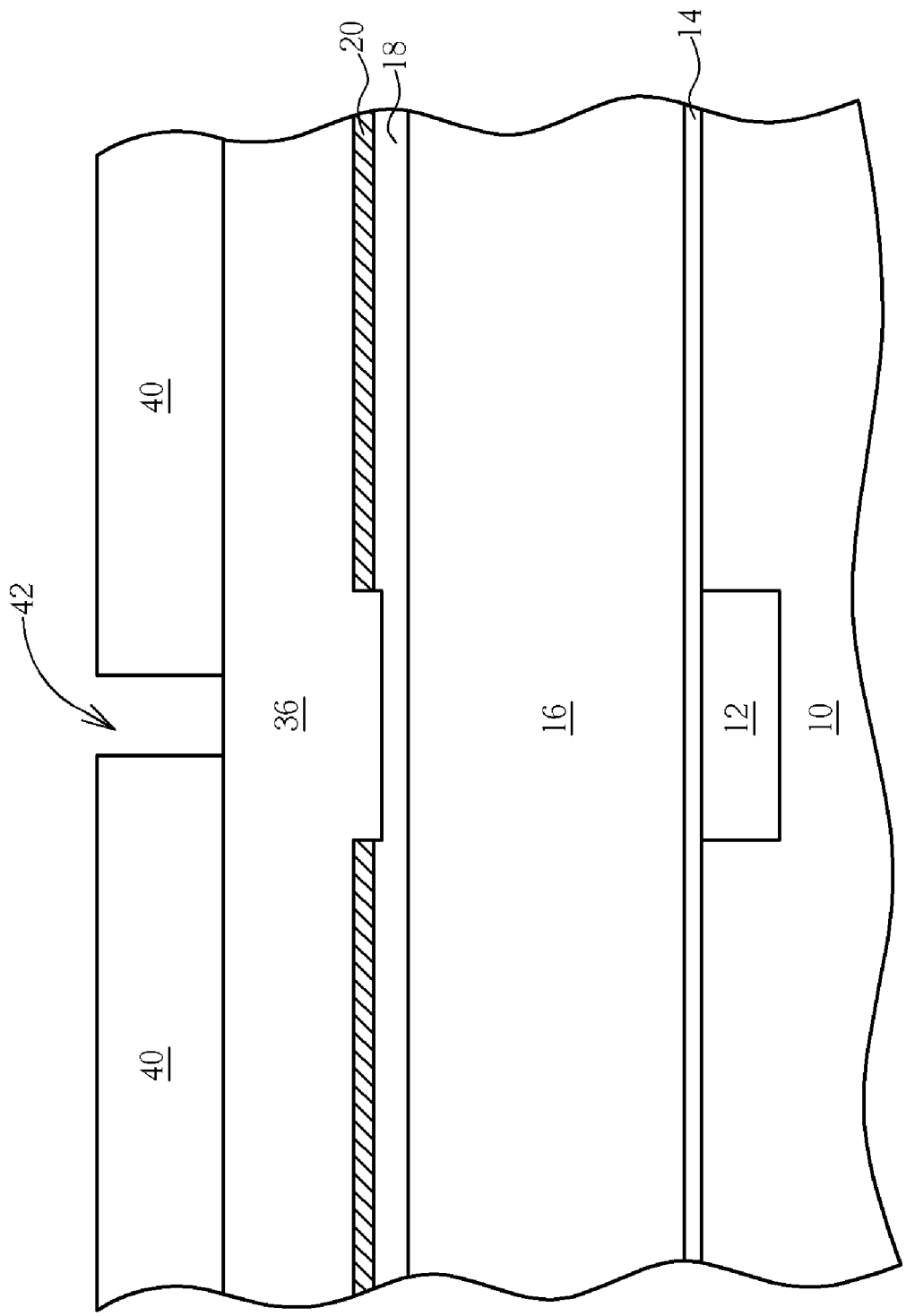
Figure 4:
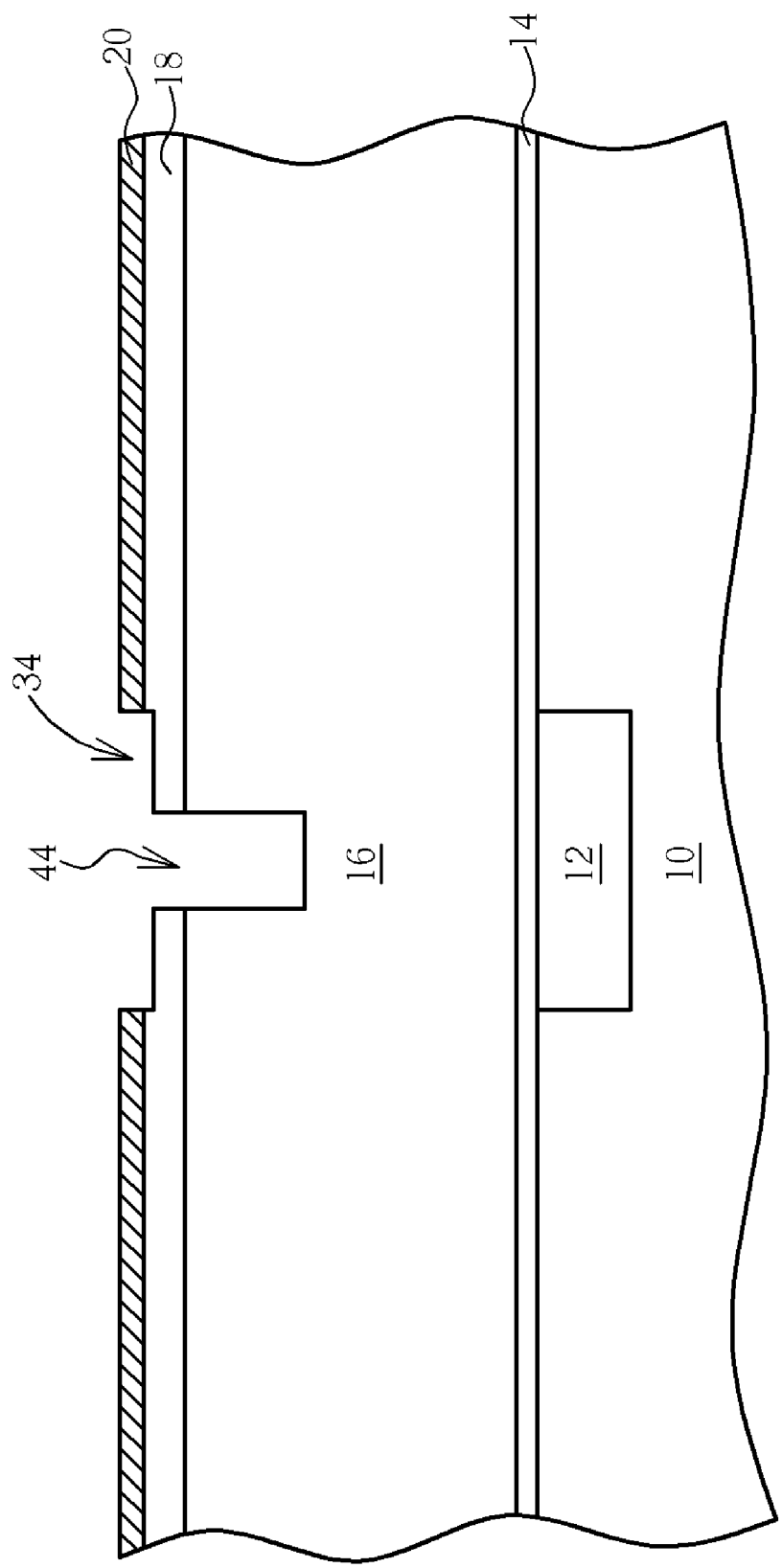
Figure 5:
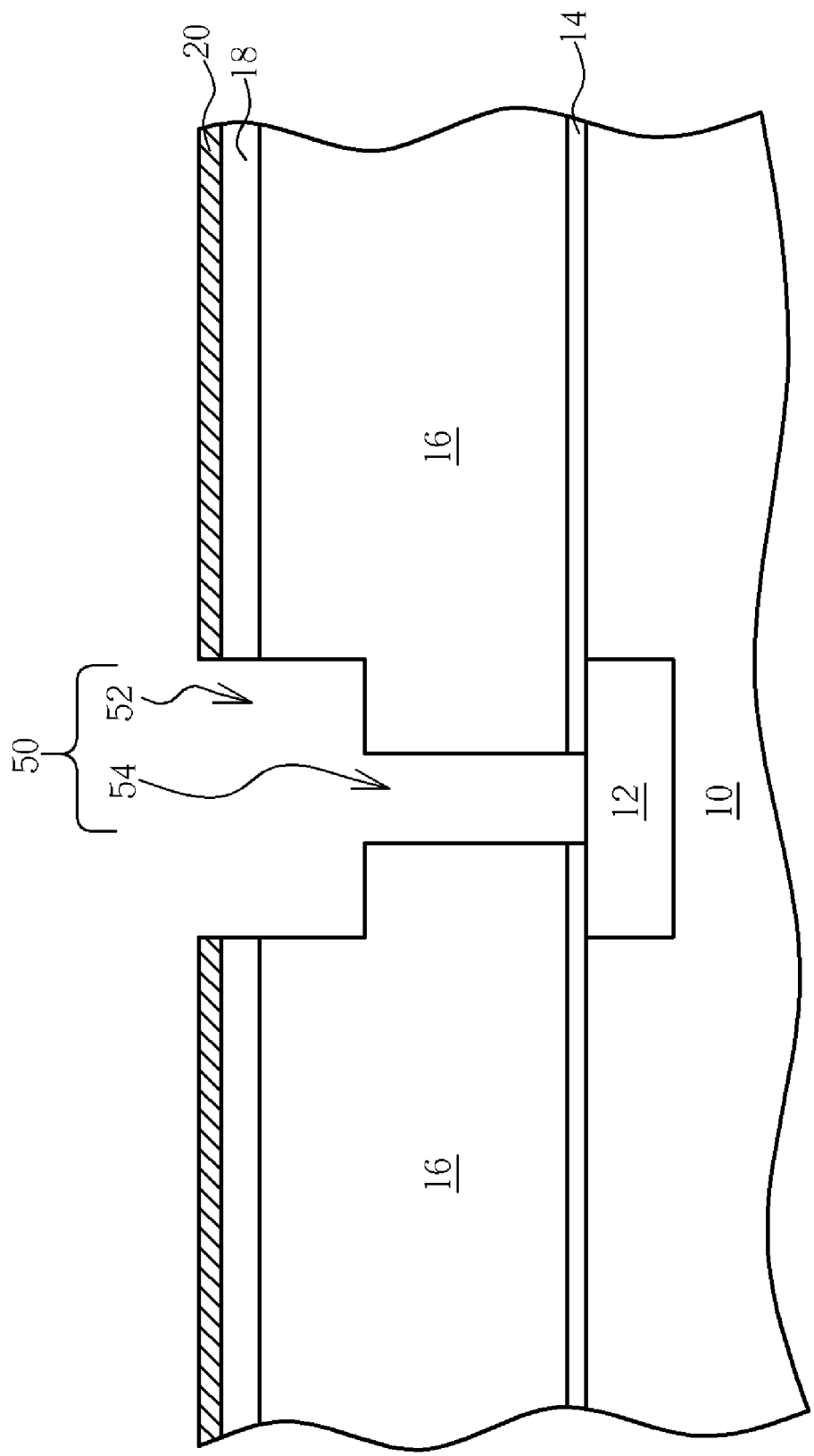
Figure 6:
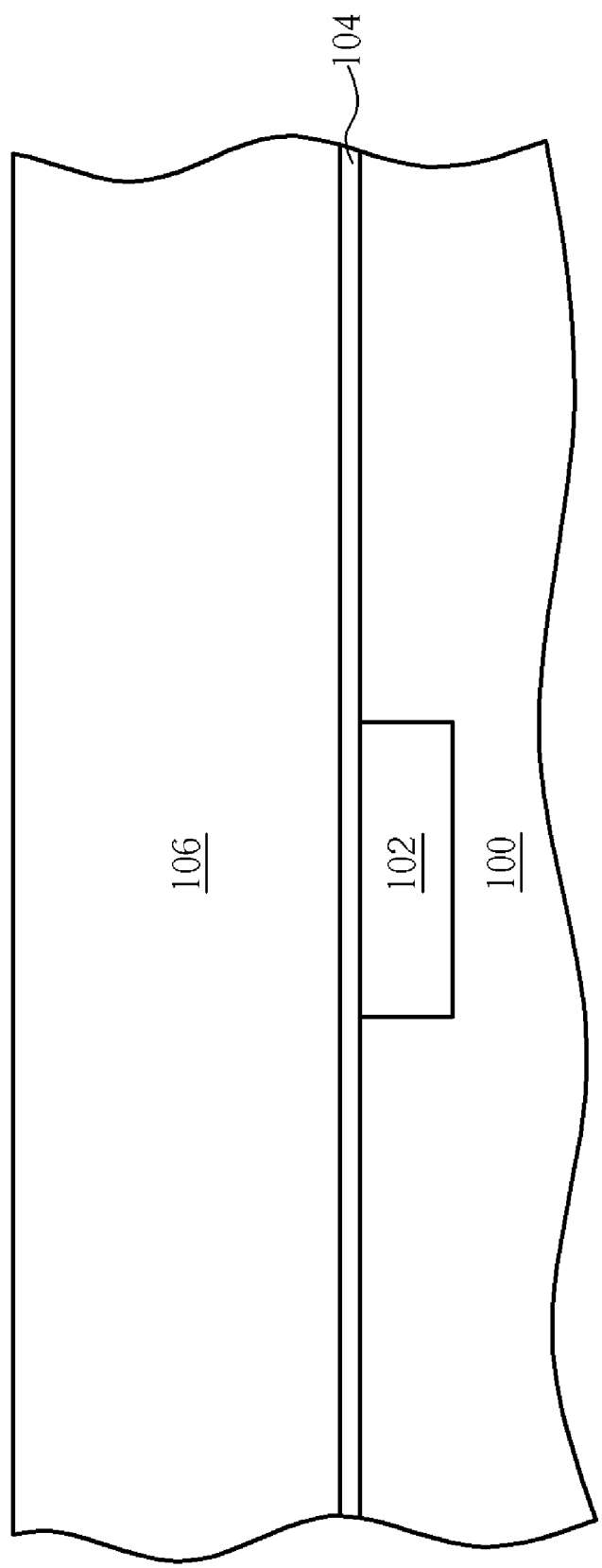
FIGS. 6-11 are schematic drawings illustrating a first preferred embodiment of the method for manufacturing multi cap layer.

Please refer to FIGS. 6-11, which are schematic drawings illustrating a first preferred embodiment of the method for manufacturing multi cap layer according to the present invention. As shown in FIG. 6, a substrate 100 is provided. The substrate 100 comprises a conductive layer 102, a base layer 104 comprising silicon nitride, and a dielectric layer 106 sequentially formed thereon. The dielectric layer 106 comprises ultra low-K (ULK) material and has a tensile stress of about 30-80 mega Pascal (MPa).

Figure 7:
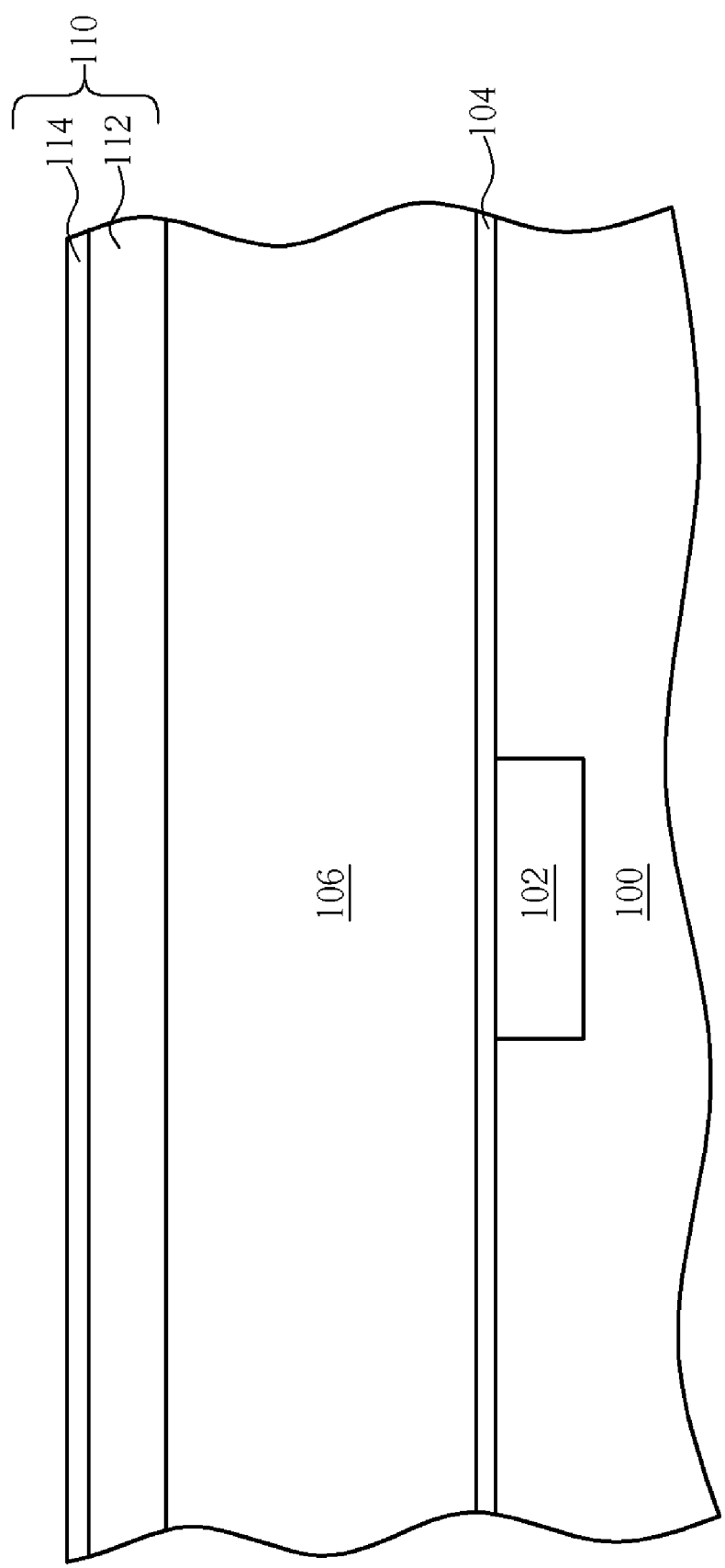

Please refer to FIG. 7. Next, a first cap layer 112 and a second cap layer 114 are sequentially formed on the substrate 100 respectively by a deposition process. The first cap layer 112 and the second cap layer 114 form a multi cap layer 110. The deposition process comprises a plasma-enhanced chemical vapor deposition (PECVD) process, a sub-atmosphere chemical vapor deposition (SACVD) process, or a low pressure chemical vapor deposition (LPCVD) process. The deposition processes for forming the first cap layer 112 and the second cap layer 114 can be performed in an in-situ manner. Silane ($SiH_4$), TEOS, tetra-methyl silane (4MS), tetra-methyl cyclo tetra-siloxane (TMCTS), diethoxy-methyl-silane (DEMS) or other silicon-containing chemical can be added in the deposition processes as a precursor and $CO_2$, $N_2O$, $O_2$, or $O_3$ can be added as an oxidizing agent. In addition, He, Ar, $N_2$, $NH_3$, $CO_2$, $O_2$ can be used in the first preferred embodiment for a pre-treatment or a post-treatment.

The first cap layer 112 and the second cap layer 114 are TEOS layers. As shown in FIG. 7, the first cap layer 112 is a tensile stress TEOS layer while the second cap layer 114 is a protecting layer such as a hermetical TEOS layer. The tensile stress TEOS layer is thicker than the hermetical TEOS layer. The deposition process used to form the tensile stress TEOS layer is performed at a high-frequency RF power of about 750-850 Watts and a low-frequency RF power of about 100-200 Watts. The deposition process used to form the hermetical TEOS layer is performed at a high-frequency RF power of about 230-330 Watts and a low-frequency RF power of about 10-100 Watts.

It is noteworthy that the tensile stress TEOS layer has a tensile stress of about 50-100 MPa and the hermetical TEOS layer has a compressive stress of about −150-−300 MPa.

Figure 8:
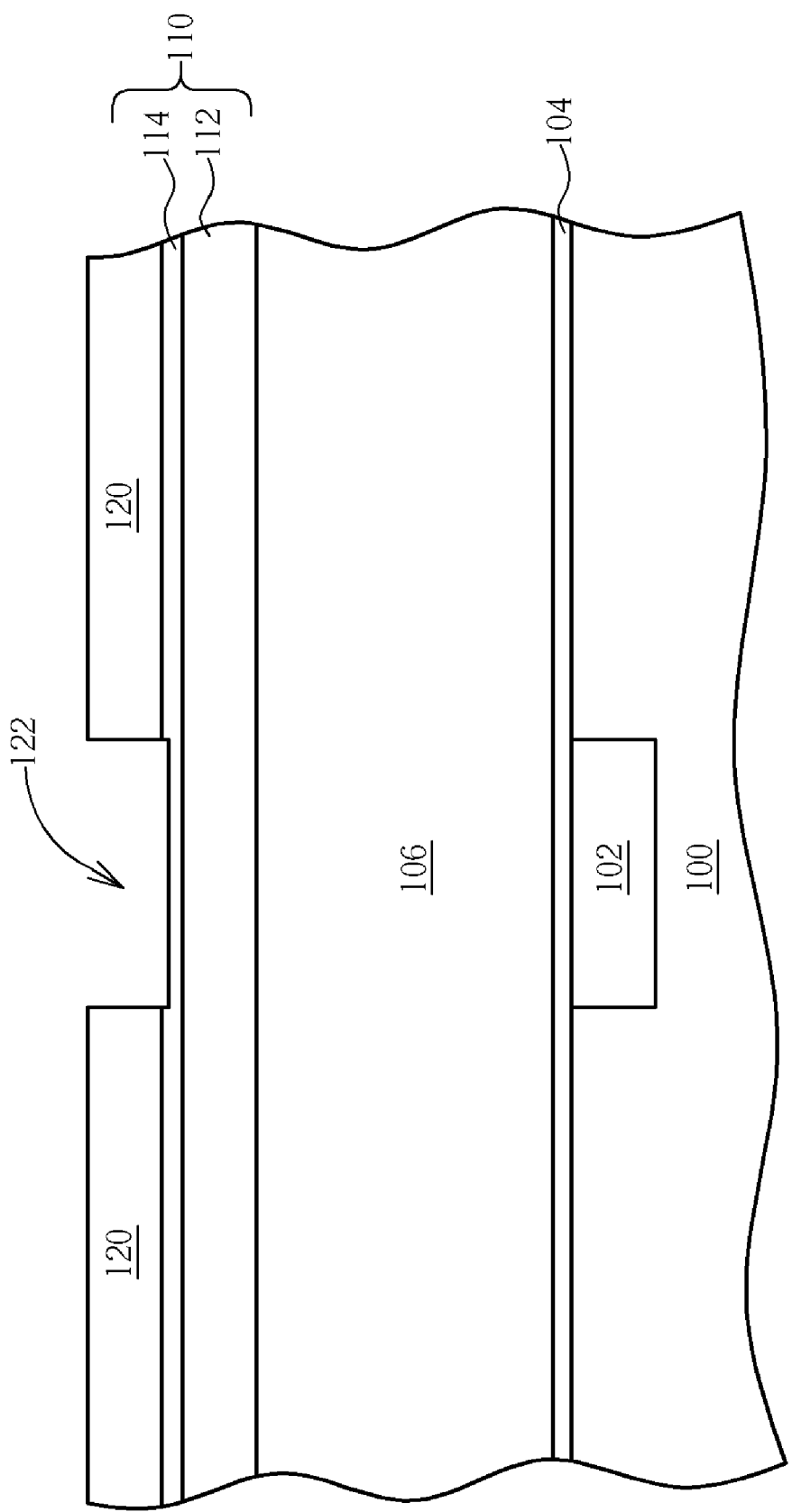

Please refer to FIG. 8. Then, a patterned hard mask layer such as a patterned metal hard mask layer 120 is formed on the multi cap layer 110. Additionally, a bottom anti-reflective coating (BARC) layer can be formed on the metal hard mask layer 120. An etching process is performed to etch the multi cap layer 110 through the patterned metal hard mask layer 120 and to form at least an opening 122 in the second cap layer 114. The opening 122 can be a trench opening or a via opening. Then, a trench-first process, a via-first process, a partial-via-first process, or a self-aligned process is alternatively performed according to the process requirement. For example, in the first preferred embodiment, opening 122 is a trench opening in a trench-first process.

Figure 9:
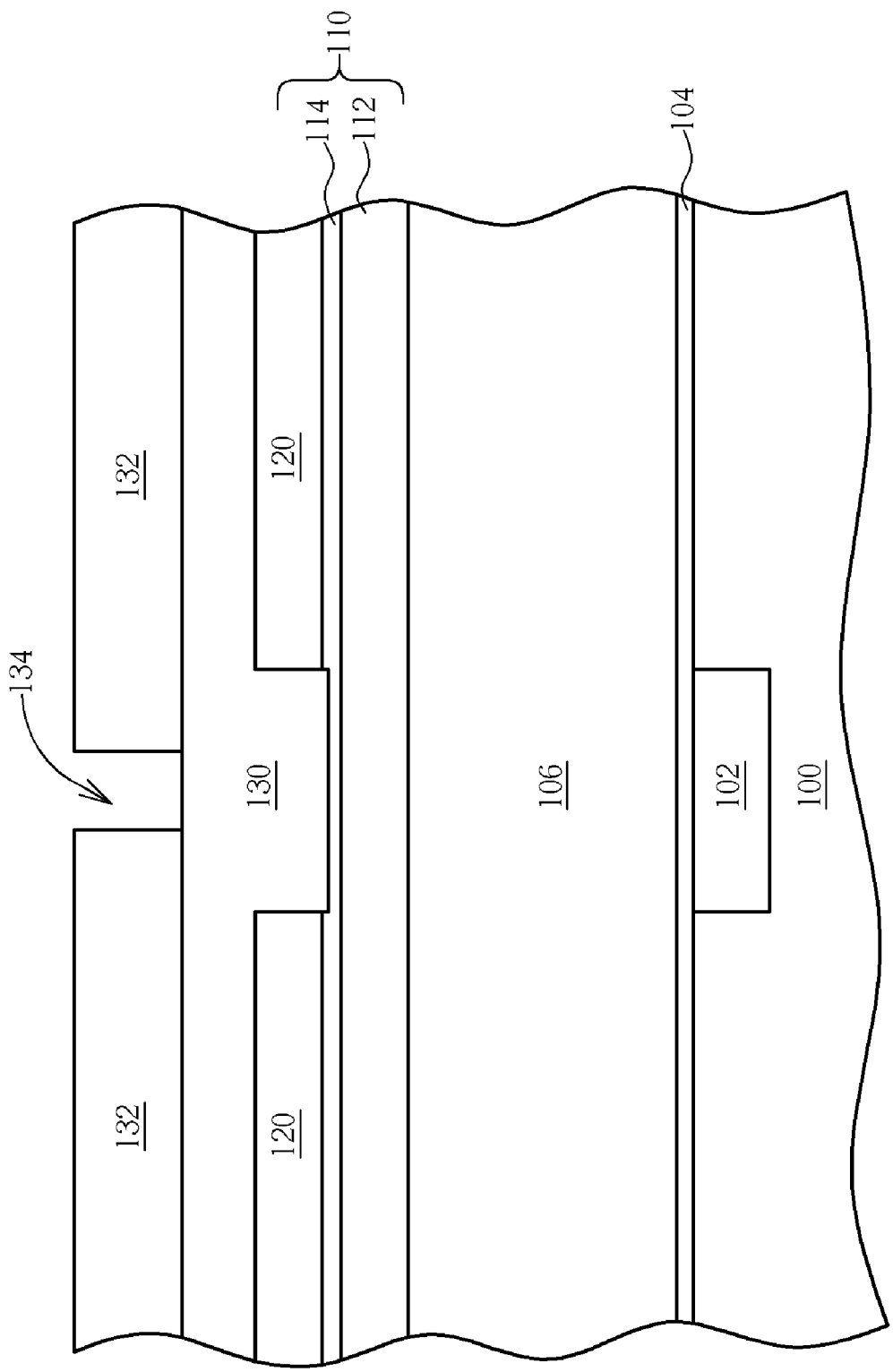
Figure 10:
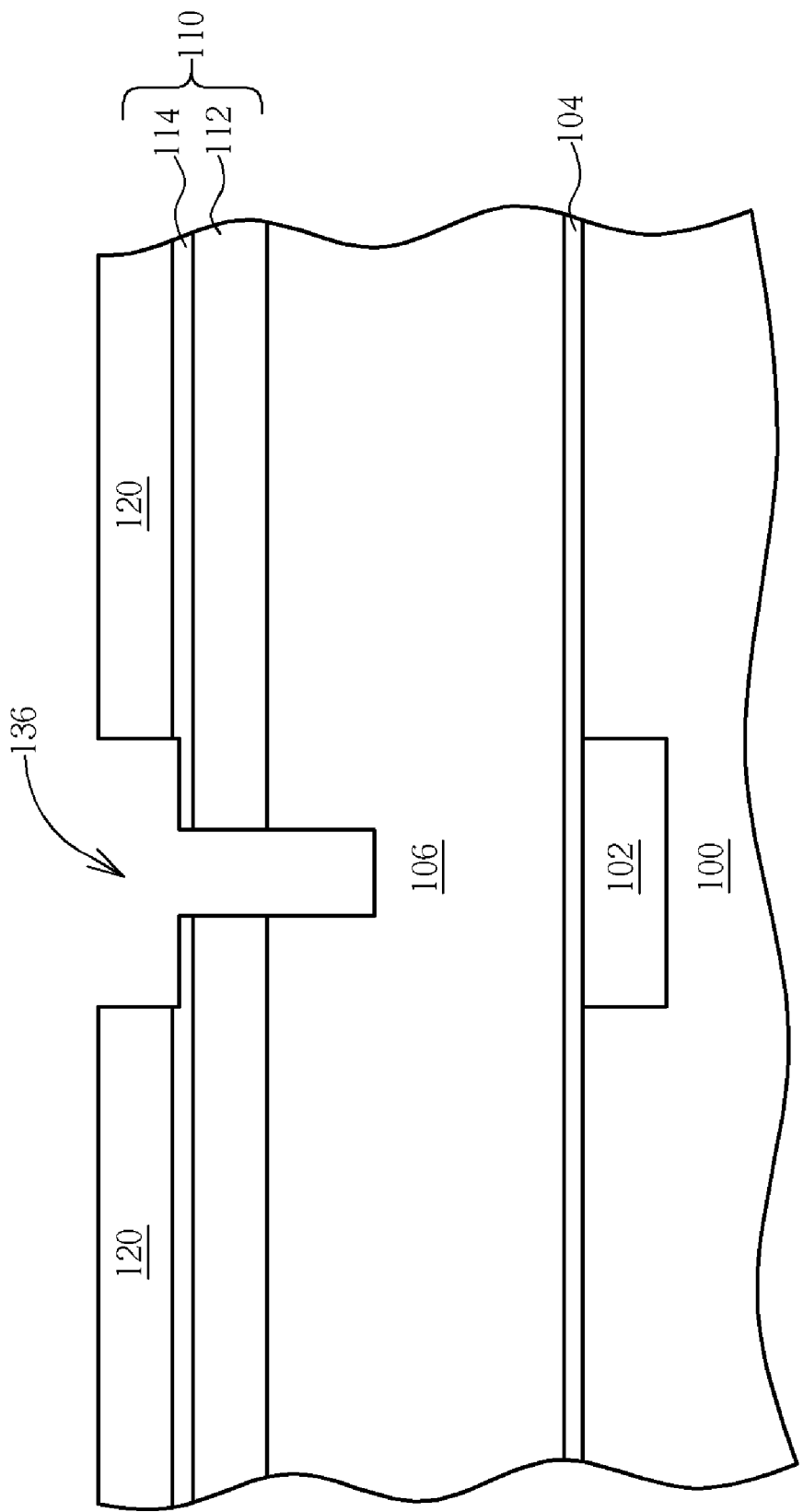

Please refer to FIG. 9. Next, a BARC layer 130 is formed on the substrate 100 and fills the opening 130, and a photoresist layer 132 is formed on the BARC layer 130. The photoresist layer 132 is patterned by a conventional photolithography method to form an opening 134 which is positioned directly above the opening 122 for defining a via pattern of a damascene structure. As shown in FIG. 10, the photoresist layer 132 functions as an etching mask in an etching process which is performed to etch the BARC layer 130, the multi cap layer 110, and the dielectric layer 106 through the opening 134. Therefore a partial via feature 136 is formed in an upper portion of the ULK layer 106. The photoresist layer 132 and the BARC layer 130 may be stripped off with an oxygen containing plasma.

Figure 11:
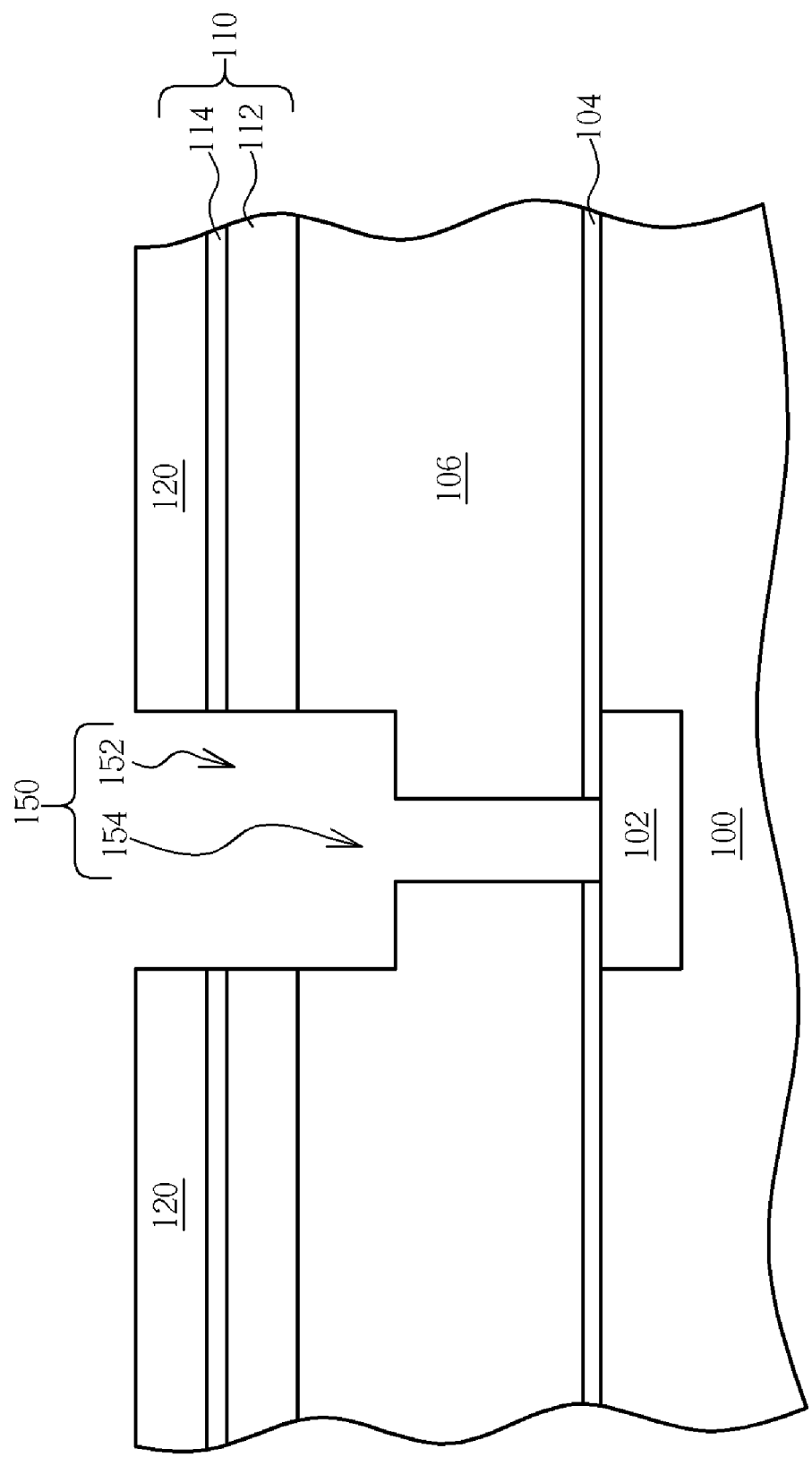

Please refer to FIG. 11. The metal hard mask layer 120 is used as an etching mask in an etching process, which is performed to etch the multi cap layer 110 not covered by the metal hard mask layer 120 and the ULK layer 106. Therefore the opening 122 and the partial via 136 are transferred into the ULK layer 106. The base layer 104 exposed is then removed to expose the conductive layer 102 and to form a dual damascene pattern 150 which comprises a trench opening 152 and a via opening 154.

Figure 12:
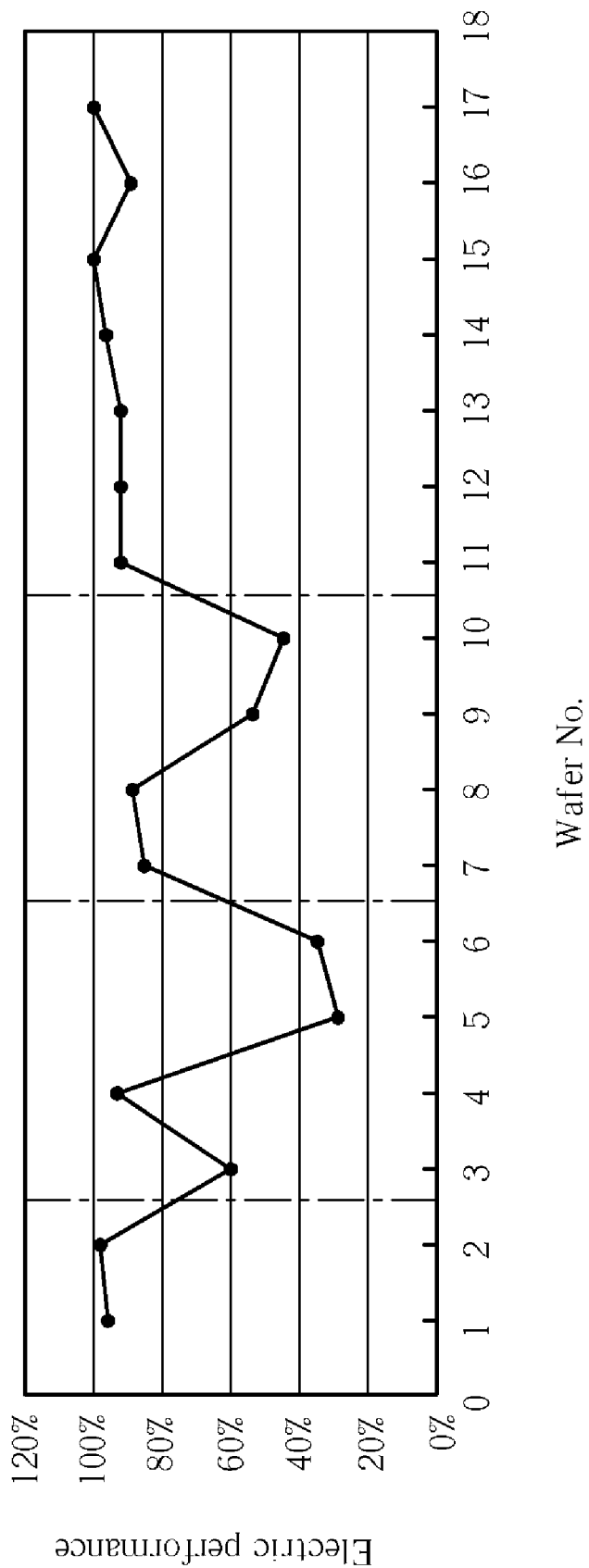
FIG. 12 is a schematic diagram for comparing electric performance of damascene structures formed by the multi cap layer provided by the present invention with the prior art.
Figure 13:
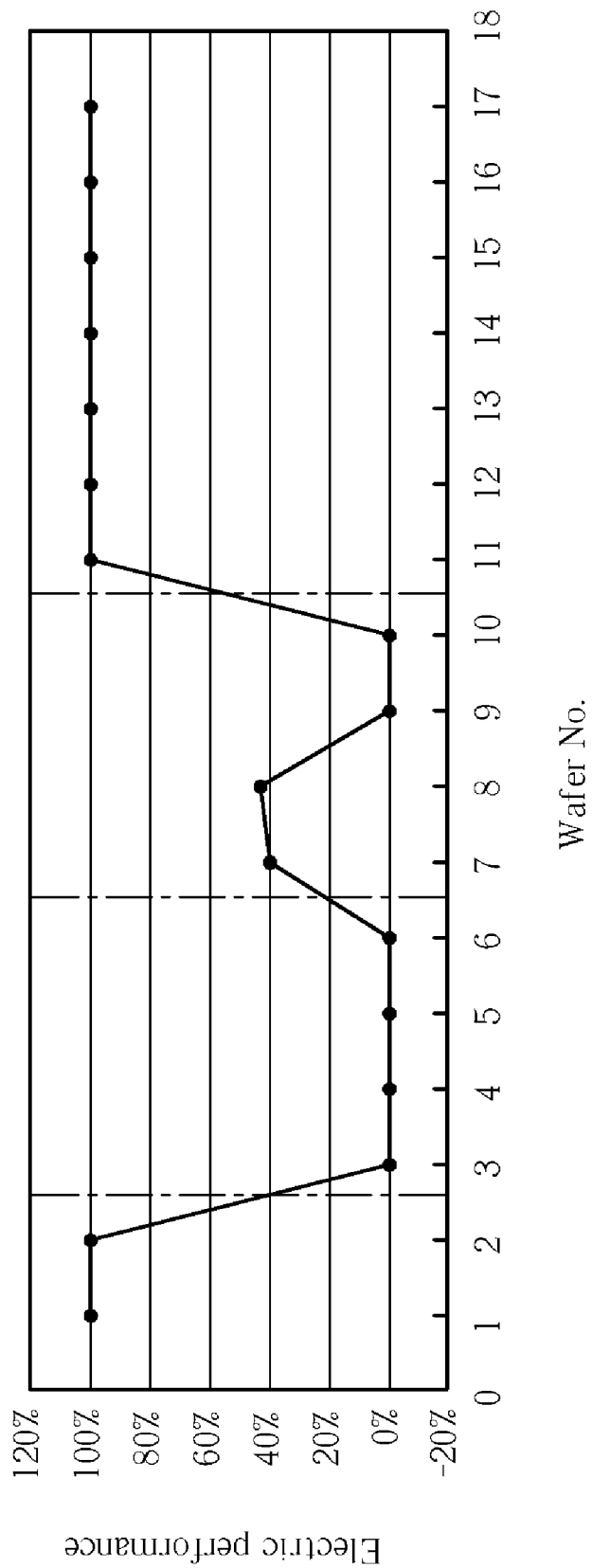
FIG. 13 is a schematic diagram for comparing electric performance of damascene structures formed by the multi cap layer provided by the present invention under Kelvin via influence with the prior art.

Please refer to FIGS. 12 and 13. FIG. 12 is a schematic diagram for comparing electric performance of damascene structures formed by the multi cap layer provided by the present invention with the prior art and FIG. 13 is a schematic diagram for comparing electric performance of damascene structures formed by the multi cap layer provided by the present invention under Kelvin via open influence with the prior art. In FIGS. 12 and 13, wafers of No. 3-6 comprise damascene structures formed by the conventional single TEOS cap layer while wafers of No. 7-9 comprise damascene structures formed by the multi bi-layer cap layer according to the first embodiment. According to the first preferred embodiment, the dielectric layer 106 is prevented from being directly influenced by the compressive stress provided by the second cap layer 14 (the hermetical TEOS layer) due to the first cap layer 112 (the tensile stress TEOS layer) acting as a buffer in between. Therefore line distortion in the dielectric layer 106 is prevented. Secondly, water from the etching process is blocked from the first cap layer 112 by the second cap layer 114 (the hermetical TEOS layer), therefore the water absorption is prevented. Thus the Kelvin via open caused by water desorption in following processes is also prevented. As shown in FIGS. 12 and 13, the electrical performance of the damascene structure formed by the multi cap layer provided by the first preferred embodiment is improved.

Figure 14:
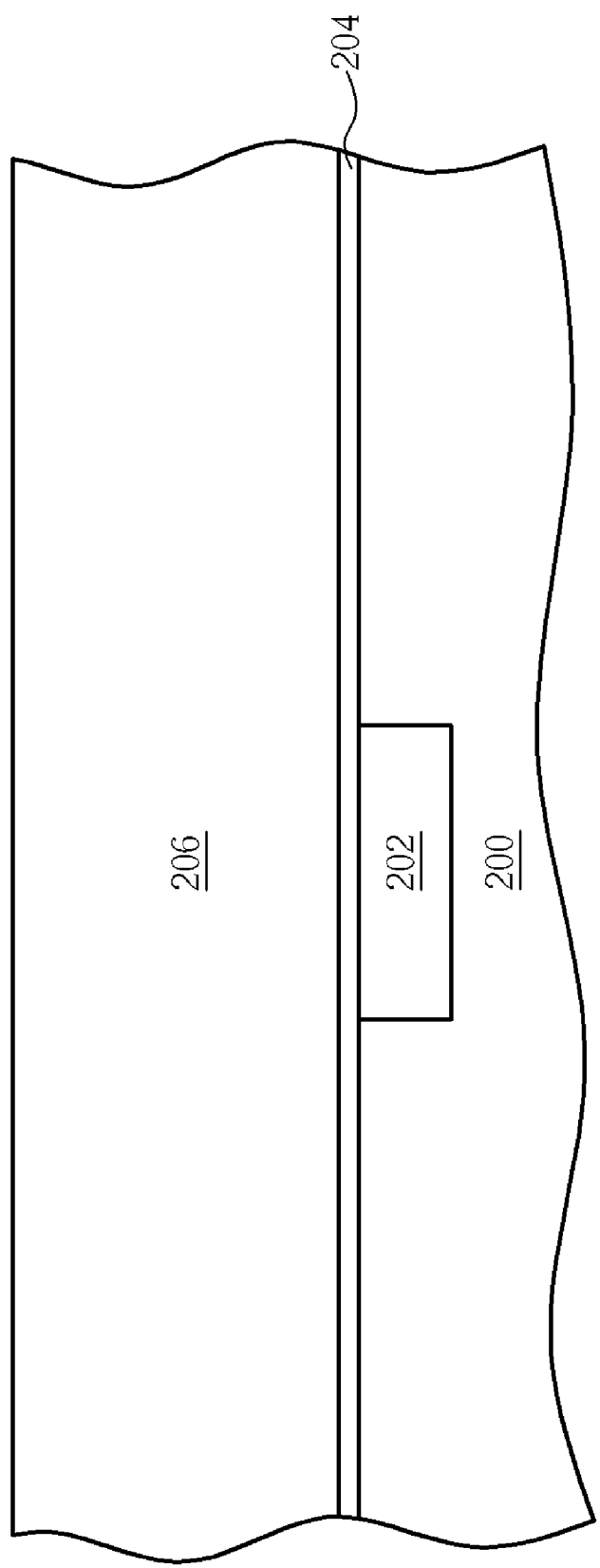
FIGS. 14-17 are schematic drawings illustrating a second preferred embodiment of the method for manufacturing multi cap layer.

Please refer to FIGS. 14-17, which are schematic drawings illustrating a second preferred embodiment of the method for manufacturing multi cap layer according to the present invention. As mentioned above, the multi cap layer provided by the second preferred embodiment is preferably applied in a damascene process. As shown in FIG. 14, a substrate 200 is provided. The substrate 200 comprises a conductive layer 202, a base layer 204 comprising silicon nitride, and a dielectric layer 206 sequentially formed thereon. The dielectric layer 206 comprises ultra low-K (ULK) material and has a tensile stress in a range of 30-80 mega Pascal (MPa).

Figure 15:
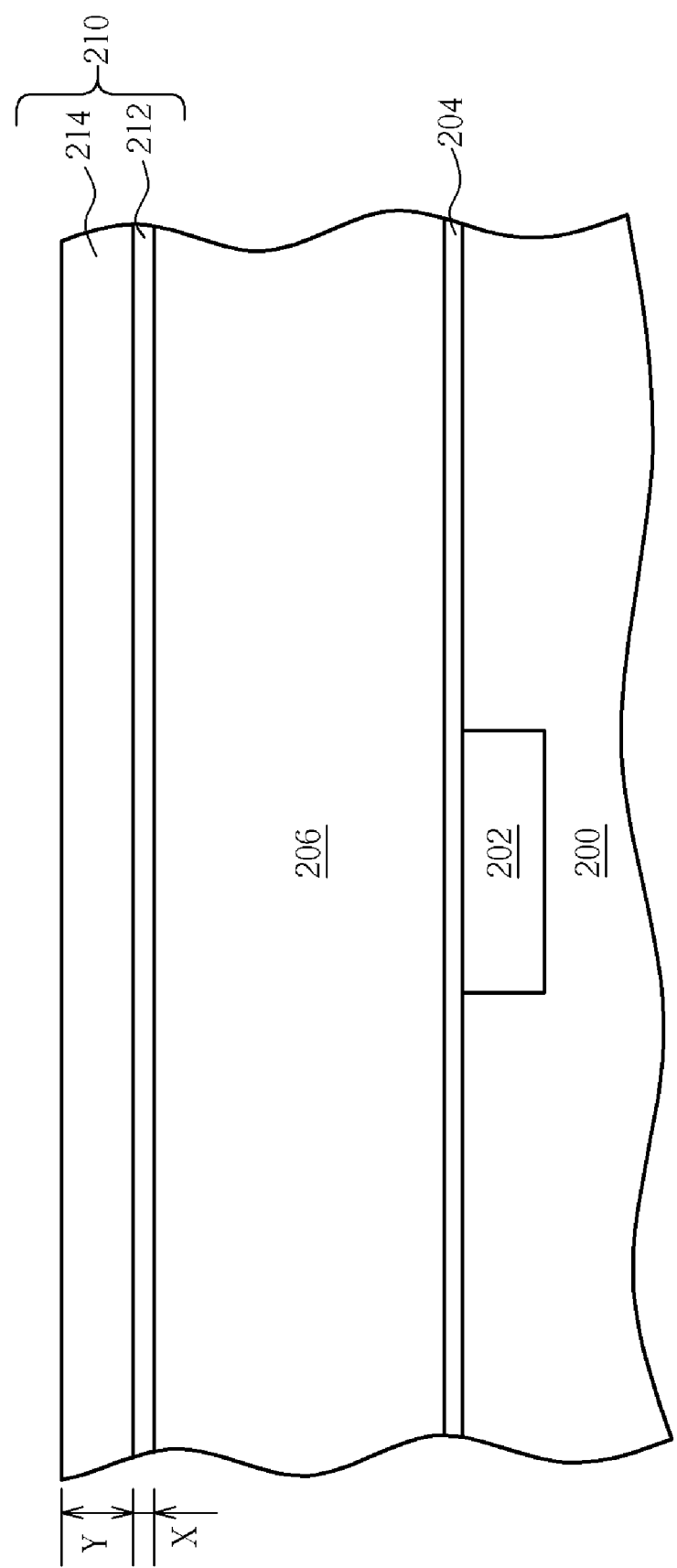

Please refer to FIG. 15. Next, a first cap layer 212 and a second cap layer 114 are sequentially formed on the substrate 200 respectively by a deposition process, wherein the first cap layer 212 is used as a first protecting layer. The first cap layer 212 and the second cap layer 214 form the multi cap layer 210. The deposition processes comprise a PECVD process, a SACVD process, or a LPCVD process. The deposition processes for forming the first cap layer 212 and the second cap layer 214 can be performed in an in-situ manner. Silane ($SiH_4$), TEOS, 4MS, TMCTS, DEMS, or other silicon-containing chemical can be added in the deposition processes as a precursor and $CO_2$, $N_2O$, $O_2$, or $O_3$ can be added as an oxidizing agent. In addition, He, Ar, $N_2$, $NH_3$, $CO_2$, $O_2$ can be used in the first preferred embodiment for a pre-treatment or a post-treatment.

The first cap layer 212 and the second cap layer 214 are TEOS layers. The first cap layer 212 is a hermetical TEOS layer while the second cap layer 114 is a tensile stress TEOS layer. Please note that a thickness Y of the tensile stress TEOS layer is larger than a thickness X of the hermetical TEOS layer. The deposition process used to form the tensile stress TEOS layer is performed at a high-frequency RF power of about 750-850 Watts and a low-frequency RF power of about 100-200 Watts. The deposition process used to form the hermetical TEOS layer is performed at a high-frequency RF power of about 230-330 Watts and a low-frequency RF power of about 10-100 Watts. The tensile stress TEOS layer has a tensile stress of about 50-100 MPa and the hermetical TEOS layer has a compressive stress of about −150−−300 MPa. Next, a patterned hard mask layer is formed on the multi cap layer 110 for following processes as mentioned above. Because the processes are the same with the first preferred embodiment, further description of the process is omitted in the interest of brevity in the second embodiment.

Figure 16:
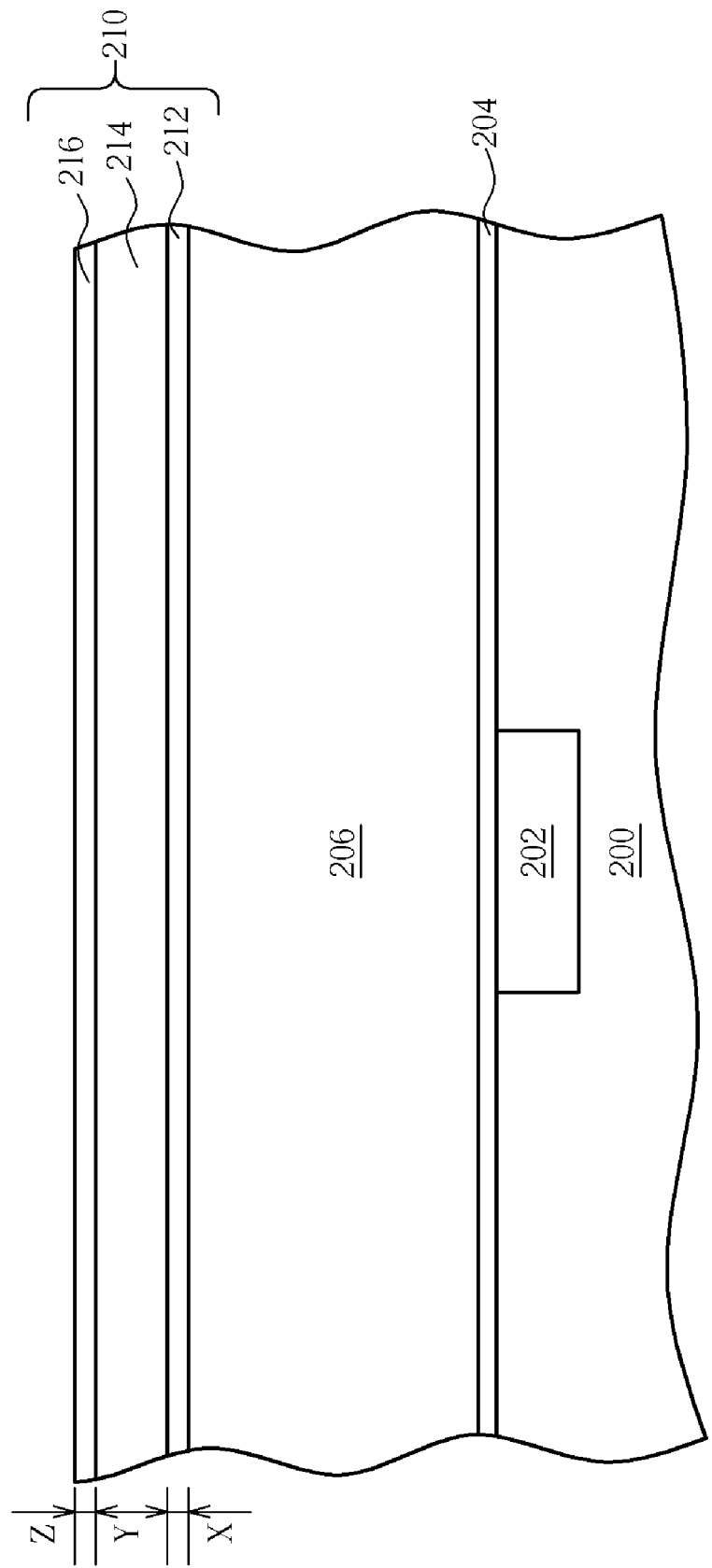

Please refer to FIG. 16. According to the second preferred embodiment of the present invention, a third cap layer 216 being a second protecting layer is formed on the second cap layer 214. The third cap layer 216 is a hermetical TEOS layer formed by a deposition process such as a PECVD process, a SACVD process, or a LPCVD process. The deposition process used to form the hermetical TEOS layer is performed at a high-frequency RF power of about 230-330 Watts and a low-frequency RF power of about 10-100 Watts. The third cap layer 216 has compressive stress of about −150−−300 MPa. The deposition processes for forming the first cap layer 212, the second cap layer 214, and the third cap layer 216 can be performed in an in-situ manner. The third cap layer 216 has a thickness Z. It is noteworthy that the thickness Y of the second cap layer is larger than sum of the thickness X of the first cap layer 212 and the thickness Z of the third cap layer 216. The thickness X of the first cap layer 212, the thickness Y of the second cap layer 214, and the thickness Z of the third cap layer 216 has a ratio in a range of 1:2:1 to 1:10:1 and preferably in 1:3:1.

Figure 17:
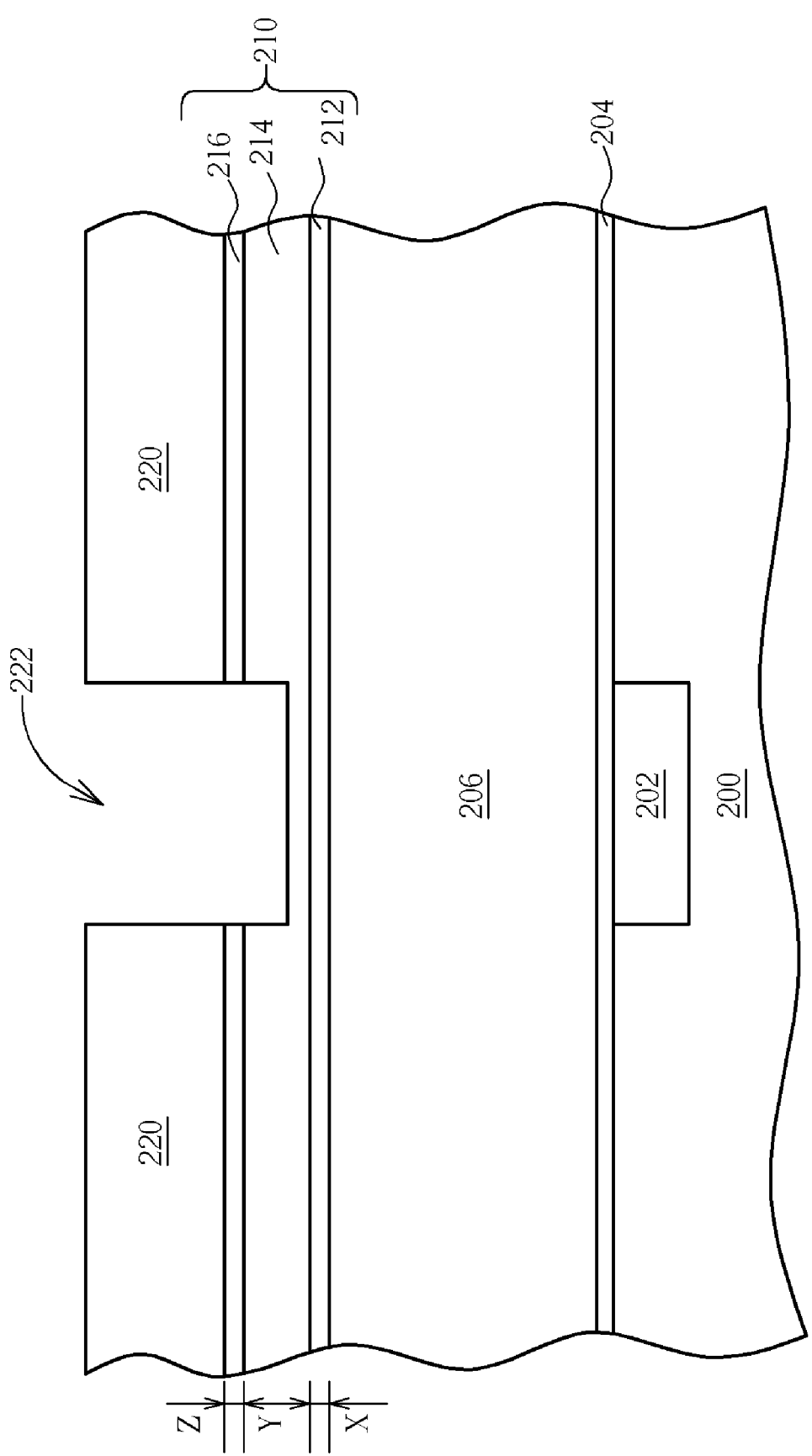

Please refer to FIG. 17. Then, a patterned hard mask layer 220 such as a patterned silicon nitride, silicon oxide, or metal hard mask layer is formed on the multi cap layer 210. Additionally, a bottom anti-reflective coating (BARC) layer can be formed on the hard mask layer 220. An etching process is performed to etch the multi cap layer 210 through the patterned hard mask layer 220 and form at least an opening 222 in the second cap layer 214 and the third cap layer 216. The opening 222 can be a trench opening or a via opening. Then, other processes are performed to form a damascene structure as mentioned above. Because the processes is the same with the first preferred embodiment, further description of the process is omitted in the interest of brevity in the second embodiment.

According to the multi cap layer 210 provided by the second preferred embodiment, the dielectric layer 206 is prevented from being directly influenced by the compressive stress provided by the first cap layer 212 and the third cap layer 216 of the multi cap layer 210 due to the thicker second cap layer 214 acting as a buffer in between. Therefore line distortion in the dielectric layer 206 is prevented. Secondly, water is blocked from the second cap layer 214 by the third cap layer 216 in the etching process, while water desorbed from the second cap layer 214 is also blocked from the dielectric layer 206 by the first cap layer 212. Therefore the water absorption in the dielectric layer 206 is prevented and the Kelvin via open is also prevented. Please refer to FIGS. 12 and 13 again. In FIGS. 12 and 13, wafer of No. 11-18 comprise damascene structures formed by the multi tri-layer cap layer according to the second embodiment. As shown in FIGS. 12 and 13, the electrical performance of the damascene structure formed by the multi cap layer provided by the second preferred embodiment is substantially improved.

Please refer to FIG. 7 again. According to the first preferred embodiment of the present invention, a multi cap layer 110 in damascene process is provided. The multi cap layer 110 comprises a first cap layer 112 and a second cap layer 114. The first cap layer 112 is a tensile stress layer while the second cap layer 114 is a first protecting layer. As shown in FIG. 7, the thickness of the tensile stress layer (the first cap layer 112) is larger than that of the first protecting layer (the second cap layer 114).

Please still refer to FIG. 7. The first cap layer 112 and the second cap layer 114 comprises TEOS. The second cap layer 114 is a hermetical TEOS layer. Furthermore, the first cap layer 112 has a tensile stress of about 50-100 MPa and the second cap layer 114 has a compressive stress of about −150−−300 MPa.

Please refer to FIG. 15 again. According to the second preferred embodiment of the present invention, a multi cap layer 210 used in damascene process is provided. The multi cap layer 210 comprises a first cap layer 212 and a second cap layer 214. The first cap layer 212 is a first protecting layer while the second cap layer 214 is a tensile stress layer. As shown in FIG. 13, the thickness of the tensile stress layer (the second cap layer 214) is larger than that of the first protecting layer (the first cap layer 212).

Please refer to FIG. 15 again. The first cap layer 212 and the second cap layer 214 comprises TEOS. The first cap layer 212 is a hermetical TEOS layer. Furthermore, the second cap layer 214 has a tensile stress of about 50-100 MPa and the first cap layer 212 has a compressive stress of about −150−−300 MPa.

According to multi cap layer 110 and 210 provided by the first and second preferred embodiments, a pre-layer is prevented from being directly influenced by the stress provided by the first protecting layer of the multi cap layer due to the thicker tensile stress layer acting as a buffer in between. Therefore line distortion in the pre-layer is prevented. Secondly, since the first protecting layer is a hermetical TEOS layer, water from the etching process is blocked from the tensile stress layer by the first protecting layer, or the water absorption from the tensile stress layer is prevented. Thus the Kelvin via caused by water desorption from the tensile stress layer in following processes is also prevented.

Please refer to FIG. 16. According to the second embodiment of the present invention, the multi cap layer 210 further comprises a third cap layer 216 acting as a second protecting layer positioned on the second cap layer 214. The third cap layer 216 also comprises TEOS and is a hermetical TEOS layer. The third cap layer 216 has a compressive stress of about −150−−300 MPa.

As shown in FIG. 16. The first cap layer 212, the second cap layer 214, and the third cap layer 216 respectively have a thickness X, Y, and Z. The thickness Y of the second cap layer 214 is larger than sum of the thickness X of the first cap layer 212 and the thickness Z of the third cap layer 216. More particularly, the thickness X of the first cap layer 212, the thickness Y of the second cap layer 214, and the thickness Z of the third cap layer 216 have a ratio in a range of 1:2:1 to 1:10:1, and preferably in 1:3:1.

According to the second preferred embodiment, the compressive stress provided by the first protecting layer and the third protecting layer of the multi cap layer is eased off by the thicker tensile stress layer in between. Therefore line distortion in pre-layer is prevented. Secondly, water is blocked from the tensile stress layer by the second protecting layer in the etching process, while the desorbed water is also blocked from the pre-layer by the first protecting layer in following processes. Therefore the water absorptions in the tensile stress layer and in pre-layer are both prevented. Thus the Kelvin via is also prevented.

In summary, according to the multi cap layer and manufacturing method thereof provided by the present invention, line distortion due to stress in pre-layer is prevented. In addition, because the protecting layer of the multi cap layer effectively prevents the pre-layer from water absorption, the Kelvin via is also avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing a dual damascene opening comprising a trench opening and a via opening, the method comprising steps of:

providing a substrate comprising at least a conductive layer, a base layer, and a dielectric layer;

forming a multi cap layer sequentially consisting of a first cap layer, a second cap layer, and a third cap layer directly formed on the dielectric layer;

forming a patterned metal hard mask layer on the multi cap layer; and performing an etching process to etch the multi cap layer and the dielectric layer through the patterned metal hard mask layer and to form the trench opening in the dielectric layer, wherein a bottom of the trench opening is in middle of the dielectric layer, wherein the first cap layer is a hermetical tetra-ethyl-ortho-silicate (TEOS) layer, the second cap layer is a tensile stress TEOS layer, and the third cap layer is a hermetical TEOS layer, and wherein the second cap layer is thicker than the first cap layer and the third cap layer; and a thickness ratio between the first cap layer, the second cap layer, and the third cap layer is in a range of 1:2:1 to 1:10:1.

2. The method of claim 1, wherein the dielectric layer comprises ultra low-K material.

3. The method of claim 2, wherein the dielectric layer comprises a tensile stress in a range of 30-80 mega Pascal (MPa).

4. The method of claim 1, wherein the first cap layer, the second cap layer, and the third cap layer are formed by a deposition process.

5. The method of claim 4, wherein the deposition processes comprise a plasma-enhanced vapor deposition (PECVD) process, a sub-atmosphere chemical vapor deposition (SACVD) process, or a low pressure chemical vapor deposition (LPCVD) process.

6. The method of claim 4, wherein the deposition processes used to form the first cap layer, the second cap layer, and the third cap layer are performed in an in-situ manner.

7. The method of claim 4, wherein the deposition process used to form the tensile stress TEOS layer is performed at a high-frequency RF power of 750-850 Watts and a low-frequency RF power of 100-200 Watts.

8. The method of claim 4, wherein the deposition process used to form the hermetical TEOS layers is performed at a high-frequency RF power of 230-330 Watts and a low-frequency RF power of 10-100 Watts.

* * * * *